United States Patent [19]
Lee

[11] Patent Number: 6,151,271
[45] Date of Patent: Nov. 21, 2000

[54] INTEGRATED CIRCUIT MEMORY DEVICES HAVING DATA SELECTION CIRCUITS THEREIN WHICH ARE COMPATIBLE WITH SINGLE AND DUAL RATE MODE OPERATION AND METHODS OF OPERATING SAME

[75] Inventor: Jung-bae Lee, Kyungki-do, Rep. of Korea

[73] Assignee: Samsung Electronics Co., Ltd., Rep. of Korea

[21] Appl. No.: 09/235,471

[22] Filed: Jan. 22, 1999

[30] Foreign Application Priority Data

Jan. 23, 1998 [KR] Rep. of Korea ......................... 98-2052

[51] Int. Cl.[7] ....................................................... G11C 8/00
[52] U.S. Cl. .................. 365/233; 365/233.5; 365/230.04; 365/225.7; 365/194
[58] Field of Search ................................. 365/233, 233.5, 365/230.04, 225.7, 194

[56] References Cited

U.S. PATENT DOCUMENTS

| | | | |
|---|---|---|---|
| 4,758,995 | 7/1988 | Sato | 365/230 |
| 5,844,859 | 12/1998 | Iwamoto et al. | 365/233 |
| 5,892,730 | 1/2000 | Sato et al. | 365/233 |
| 6,014,759 | 1/2000 | Manning | 365/189.05 |

OTHER PUBLICATIONS

Saeki et al., "SP23.4: A 2.5ns Clock Access 250MHz 256Mb SDRAM With a Synchronous Mirror Delay", ISSCC, 1996, pp. 374–375.

*Primary Examiner*—Richard Elms
*Assistant Examiner*—Tuan T. Nguyen
*Attorney, Agent, or Firm*—Myers Bigel Sibley & Sajovec

[57] ABSTRACT

Integrated circuit memory devices include first and second memory banks, first and second local data lines electrically coupled to the first and second memory banks, respectively, and a multiplexer having first and second inputs electrically coupled to first and second data bus lines, respectively. A data selection circuit is also provided which routes data from the first and second local data lines to the first and second data bus lines, respectively, when a selection control signal is in a first logic state and routes data from the second and first local data lines to the first and second data bus lines, respectively, when a selection control signal is in a. second logic state opposite the first logic state. A control signal generator is also provided. This control signal generator generates the selection control signal in the first and second logic states when a first address in a string of burst addresses is even and odd, respectively.

20 Claims, 5 Drawing Sheets

INTEGRATED CIRCUIT MEMORY DEVICES HAVING DATA SELECTION CIRCUITS THEREIN WHICH ARE COMPATIBLE WITH SINGLE AND DUAL RATE MODE OPERATION AND METHODS OF OPERATING SAME

RELATED APPLICATION

This application is related to Korean Application No. 98-2052, filed Jan. 23, 1998, the disclosure of which is hereby incorporated herein by reference.

FIELD OF THE INVENTION

The present invention relates to integrated circuit devices, and more particularly to integrated circuit memory devices and methods of operating integrated circuit memory devices.

BACKGROUND OF THE INVENTION

Computer systems typically include a central processing unit (CPU) for performing commands and a main memory for storing data and programs required by the CPU. Thus, increasing the operational speed of the CPU and reducing the access time of the main memory can enhance the performance of the computer system. As will be understood by those skilled in the art, a synchronous DRAM (SDRAM) operates according to control of a system clock and typically provides a short access time when used as a main memory.

In particular, the operation of the SDRAM is controlled in response to pulse signals generated by transitions of a system clock. Here, the pulse signals are generated during a single data rate SDR mode or a dual data rate DDR mode. The SDR mode generates pulse signals with respect to transitions in one direction (e.g., pulse signals of 'high' to 'low' or vice versa) to operate a DRAM device. However, the DDR mode generates pulse signals with respect to transitions in both directions (e.g., pulse signals of 'high' to 'low' and vice versa) to operate the DRAM device.

The DDR mode enables a memory device to have wide bandwidth operation. Thus, the DDR mode is very helpful when making an ultra-high speed SDRAM. However, to implement the DDR mode, the layout area of the memory device typically must be increased because twice as many data lines may need to be provided. Also, in the DDR mode compared with the SDR mode, set-up time and data hold time between data and the clock during reading and writing are reduced, so that auxiliary circuits (e.g., phase locked loops (PLL) or delay locked loops (DLL)) for delaying an external clock are often necessary. This requirement may lead to further increase in the size of the memory chip. Therefore, only memory devices for ultra-high speed systems typically utilize the DDR mode, whereas other memory devices typically utilize the SDR mode.

Notwithstanding these known aspects of conventional memory devices, there continues to exist a need for improved memory devices and methods of operating same.

SUMMARY OF THE INVENTION

It is therefore an object of the present invention to provide improved integrated circuit memory devices and methods of operating same.

It is another object of the present invention to provide integrated circuit memory devices having dual and single data rate modes of operation and methods of operating same.

These and other objects, advantages and features of the present invention are provided by integrated circuit memory devices which include first and second memory banks, first and second local data lines electrically coupled to the first and second memory banks, respectively, and a multiplexer having first and second inputs electrically coupled to first and second data bus lines, respectively. A data selection circuit is also provided which routes data from the first and second local data lines to the first and second data bus lines, respectively, when a selection control signal is in a first logic state and routes data from the second and first local data lines to the first and second data bus lines, respectively, when a selection control signal is in a second logic state opposite the first logic state. A control signal generator is also provided. This control signal generator generates the selection control signal in the first and second logic states when a first address in a string of burst addresses is even and odd, respectively.

According to a preferred aspect of the present invention, the data selection circuit includes a first sense amplifier having an input electrically coupled to the first local data line, a second sense amplifier having an input electrically coupled to the second local data line, a first selector having a first input electrically coupled to an output of the first sense amplifier and a second input electrically coupled to an output of the second sense amplifier. A second selector is also provided which has a first input electrically coupled to the output of the first sense amplifier and a second input electrically coupled to the output of the second sense amplifier.

According to another aspect of the present invention, the first and second sense amplifiers are both responsive to a first control signal, the first and second selectors are responsive to second and third control signals, respectively, and the multiplexer is responsive to fourth and fifth control signals. The second and third control signals are in-sync with opposite edge transitions of an internal clock signal and the fourth and fifth control signals are preferably delayed versions of the second and third control signals, respectively. Thus, the timing of the internal clock signal can be used to control the timing of data transfer. A data rate mode control signal can also be used to control the timing of the internal clock signal relative to a system clock and thereby provide multiple data rate mode capability.

DESCRIPTION OF PREFERRED EMBODIMENTS

The present invention will now be described more fully hereinafter with reference to the accompanying drawings, in which preferred embodiments of the invention are shown.

This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
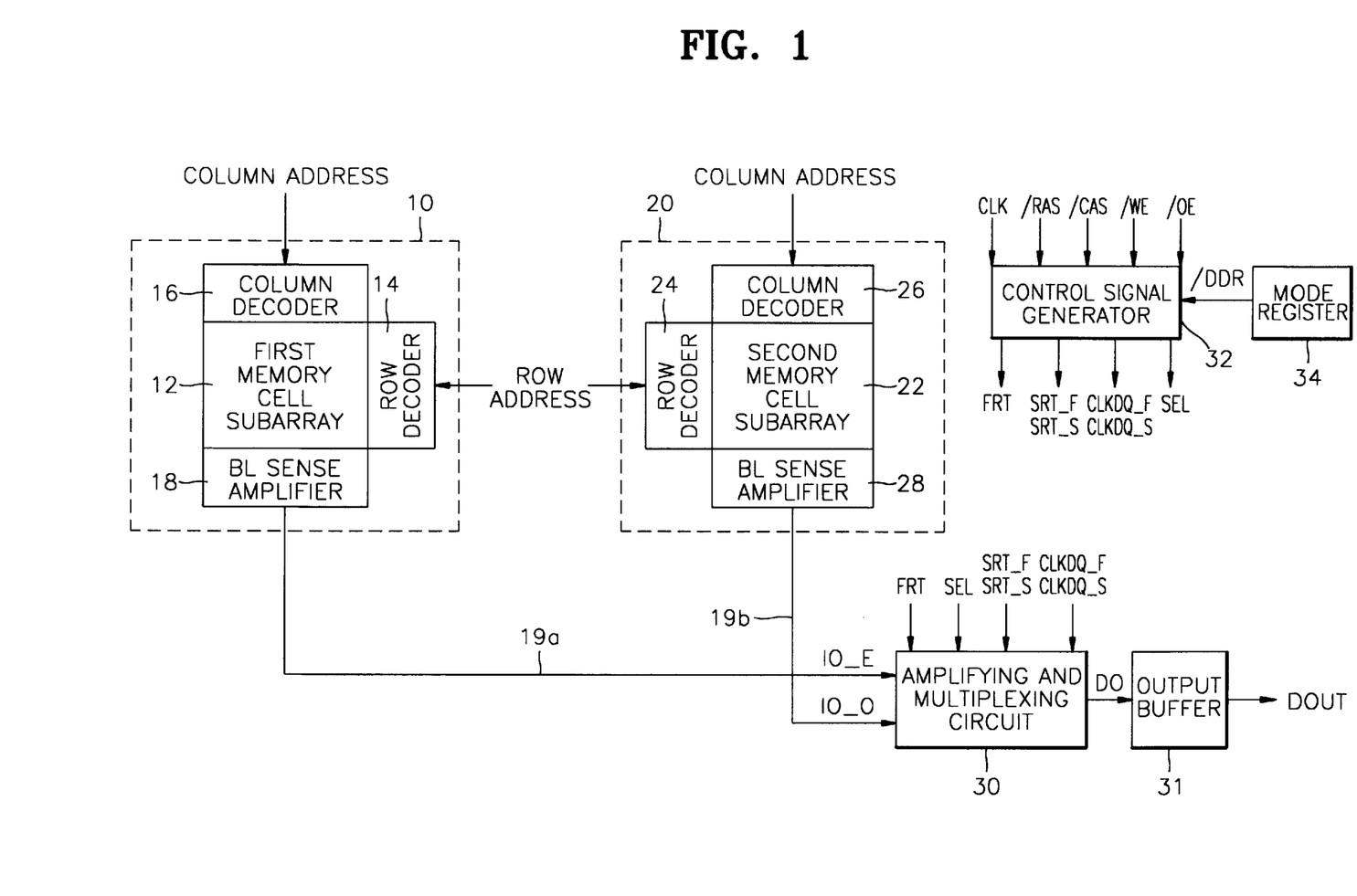
FIG. 1 is a block electrical schematic of an integrated circuit memory device according to a first embodiment of the present invention.

Referring to FIG. 1, a synchronous DRAM according to a first embodiment of the present invention includes a plurality of memory cell arrays, and each of the memory cell arrays includes a plurality of memory cell subarrays. For convenience, two memory cell subarrays are shown in FIG. 1. In detail, the synchronous DRAM of FIG. 1 includes an even-numbered memory core 10, an odd-numbered memory core 20, an amplifying and a multiplexing circuit 30, an output buffer 31, a control signal generator 32 and a mode register 34. The even-numbered memory core 10 includes a first memory cell subarray 12, a row decoder 14 and a column decoder 16. Each cell of the first memory cell subarray 12 is accessed by a row address and a column address decoded by the row decoder 14 and the column decoder 16, respectively, to thereby write data to or read data from the first memory cell subarray 12. The read data is amplified by a bit line sense amplifier 18, and the amplified data is loaded on an even local input and output line 19a. At this time, the column address applied to access the first memory cell subarray 12 is preferably an even-numbered address.

The odd-memory core 20 includes a second memory cell subarray 22, a row decoder 24 and a column decoder 26. Each cell of the second memory cell subarray 22 is accessed by a row address and a column address decoded by the row decoder 24 and the column decoder 26, respectively, to thereby read data from or write data to the second memory cell. The read data is amplified by a bit line sense amplifier 28, and the amplified data is loaded on an odd local input and output line 19b. At this time, a column address applied to access the second memory cell subarray 22 is preferably an odd numbered address. Accordingly, a predecoder can be used to delineate between odd numbered addresses when data is to be written to or read from the odd-memory core 20, and even numbered addresses when data is to be written to or read from the even-numbered memory core 10.

An amplifying and multiplexing circuit 30 receives data IO_E and IO_O output by the even-numbered memory core 10 and the odd-numbered memory core 20, respectively, multiplexes data IO_E and IO_O in response to first through fifth control signals (i.e., FRT, SRT_F, SRT_S, CLKDQ_F and CLKDQ_S) and outputs the multiplexed data DO. Data DO is buffered by the output buffer 30 and the buffered data DOUT is output to an external system bus. The amplifying and multiplexing circuit 30 is described more fully hereinbelow with respect to FIG. 2.

The control signal generator 32 of FIG. 1 receives a system clock CLK, a row address strobe signal /RAS, a column address strobe signal /CAS, a write control signal /WE and a read control signal /OE. Also, the control signal generator 32 generates various control signals to provided to the memory cell arrays. In particular, the control signal generator 32 generates five control signals as signals FRT, SRT_F, SRT_S, CLKDQ_F and CLKDQ_S and also generates a selection control signal SEL. The mode register 34 stores information for an operation mode of the SDRAM (e.g. a DDR/SDR mode, a CAS latency, a burst length, a burst sequence) and can be programmed by a manufacturer or a user.

Figure 2:
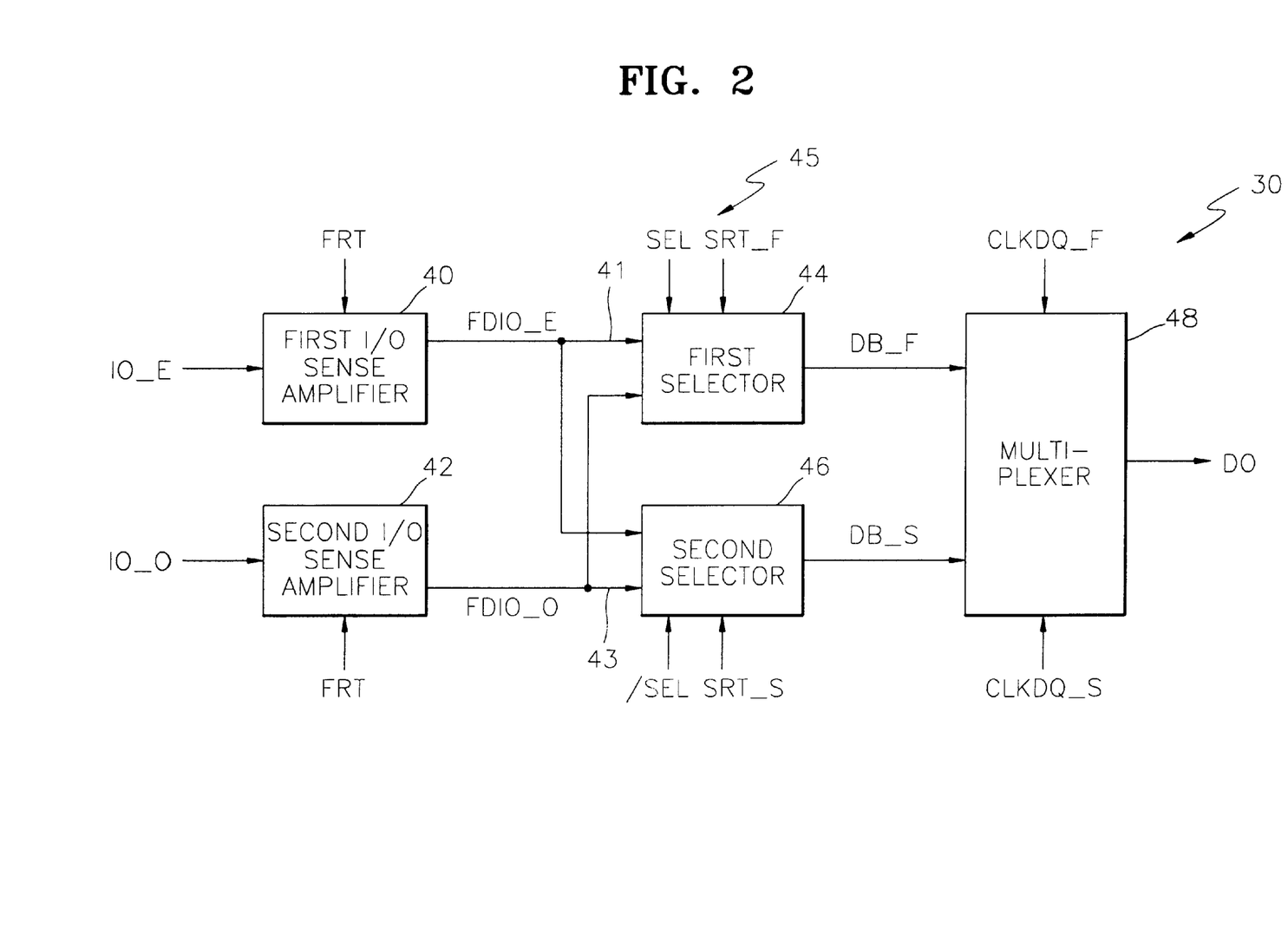
FIG. 2 is block electrical schematic of an amplifying and multiplexing circuit according to the first embodiment of the present invention.

Referring to FIG. 2, the amplifying and multiplexing circuit 30 preferably includes a multiplexer 48 and a data selection circuit 45. As illustrated, the data selection circuit 45 includes first and second I/O sense amplifiers 40 and 42 and first and second data bus selectors 44 and 46. The first I/O sense amplifier 40 receives even data IO_E output by the even-numbered memory core 10 and loaded on the local input and output line 19a. The first I/O sense amplifier 40 amplifies the even data IO_E and outputs the amplified data FDIO_E on an even global input and output line 41 in response to the first control signal FRT. The second I/O sense amplifier 42 receives odd data IO_O output by the odd-numbered memory core 20 and loaded on the local input and output line 19b. The second I/O sense amplifier 42 amplifies the odd data IO_O and outputs the amplified data FDIO_O on an odd global input and output line 43 in response to the first control signal FRT.

The first data bus selector 44 receives the even data FDIO_E output by the first I/O sense amplifier 40. The first data bus selector 44 also receives the odd data FDIO_O output by the second I/O sense amplifier 42, as illustrated. The first data bus selector 44 selects either the even data FDIO_E or the odd data FDIO_O in response to the selection control signal SEL, and outputs the selected data on first data bus DB_F, in response to the second control signal SRT_F. When the SDRAM outputs burst data and the initial column address of the output data is even-numbered, the selection control signal SEL is 'high'. When the selection control signal SEL is high, the first data bus selector 44 transfers the even data FDlO_E to the first data bus DB_F. Alternatively, when an initial column address is odd-numbered during a burst read operation, the selection control signal SEL is low (logic 0). When this occurs, the first data bus selector 44 transfers the odd data FDIO_O to the first data bus DB_F.

In addition, the second data bus selector 46 receives even data FDIO_E and odd data FDIO_O output by the first and second I/O sense amplifying amplifiers 40 and 42, respectively, and selects either the even data FDIO_E or the odd data FDIO_O, in response to the complementary selection control signal /SEL. The second data bus selector 46 then transfers the selected data to the second data bus DB_S when the third control signal SRT_S is high. In particular, when an initial column address is even-numbered during a read operation, the complementary selection control signal /SEL is 'low'. At this time, the second data bus selector 46 selects the odd data FDIO_O, and transfers the odd data to the second data bus DB_S. Alternatively, when an initial column address is odd-numbered, the complementary selection control signal /SEL is 'high'. At this time, the second data bus selector 46 selects the even data FDIO_E and transfers the selected data to the first data bus DB_F.

Accordingly, when the SDRAM outputs burst data and the initial column address is even-numbered, the first data bus selector 44 outputs data from the even-numbered memory core 10, and the second data bus selector 46 outputs data from the odd-numbered memory core 20. In contrast, when the initial column address is odd-numbered during burst mode, the first data bus selector 44 outputs data from the odd-numbered memory core 20 and the second data bus selector 46 outputs data from the even-numbered memory core 10. Thus, data which should be output first is selected by the first data bus selector 44 and data which should be output second is selected by the second data bus selector 46. When the SDRAM outputs burst data and the burst length is one (1), the second data bus selector 46 is disabled and only the first data bus selector 44 outputs data. Referring still to FIG. 2, the multiplexer 48 receives data on the first and second data buses DB_F and DB_S and outputs data on the first bus DB_F in response to the fourth control signal CLKDQ_F and outputs data on the second bus DB_S in response to the fifth control signal CLKDQ_S.

Figure 3:
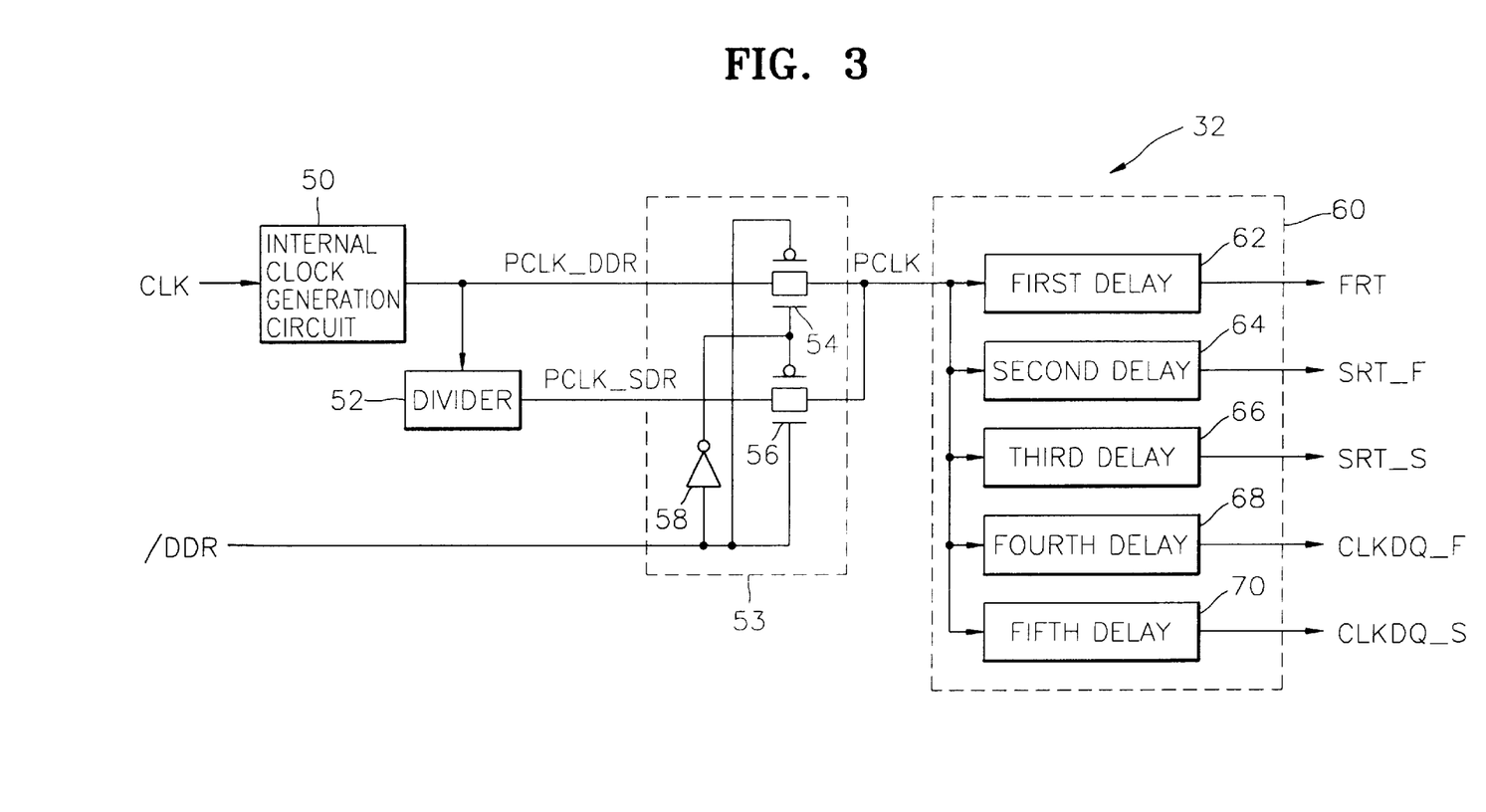
FIG. 3 is a detailed electrical schematic of a control signal generator according to the first embodiment of the present invention.

Referring now to FIG. 3, the control signal generator 32 includes, among other things, an internal clock generation subcircuit 50, a divider 52, a selector 53 and a delay unit 60. The internal clock generation subcircuit 50 includes a waveform shaping subcircuit which receives an external system clock CLK and adjusts the duty ratio of the system clock CLK (and a swing range thereof) to output an internal clock signal for a DDR mode (PCLK_DDR) having the same frequency as the CLK. The divider 52 receives the PCLK_DDR signal, divides the frequency of the PCLK_DDR signal and outputs an internal clock for a SDR mode (PCLK_SDR) having a frequency equal to one-half that of the PCLK_DDR signal.

The selector 53 selects either the PCLK_DDR signal or the PCLK_SDR signal in response to a data rate mode control signal /DDR and outputs the selected signal as an internal clock PCLK signal. When the SDRAM operates in the DDR mode, the data rate mode control signal /DDR is low. A transmission switch 54 in the selector 53 is turned on in response to a logic 0 mode control signal /DDR and the transmission switch 56 is turned off. Thus, the clock signal PCLK_DDR is output as the internal clock PCLK. In contrast, when the SDRAM operates in the SDR mode, the mode control signal /DDR is high, the transmission switch 54 is turned off and the transmission switch 56 is turned on, to thereby output the signal PCLK_SDR as the internal clock signal PCLK. The internal clock signal PCLK is also used to generate the first through fifth control signals FRT, SRT_F, SRT_S, CLKDQ_F and CLKDQ_S.

As illustrated by FIG. 1, the DDR or SDR operating mode of the SDRAM is stored in the mode register 34. The operating mode may be programmed by a manufacturer or by a user. As will be understood by those skilled in the art, the operating mode may be designated during fabrication using a respective mask (which may define an electrical connection as open circuit at a metal layer location, for example), by blowing a fuse on completed chip, or by other conventional methods.

Figure 4:
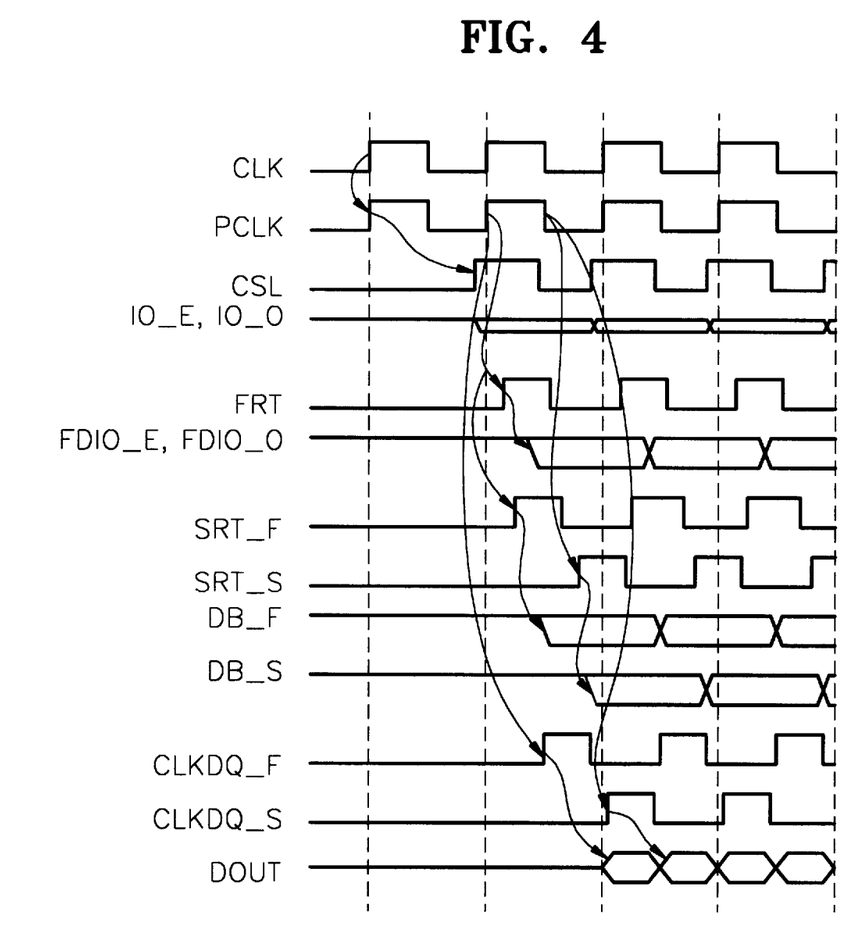
FIG. 4 is a timing diagram which illustrates operation of the memory device of FIG. 1 during dual data rate (DDR) mode operation.
Figure 5:
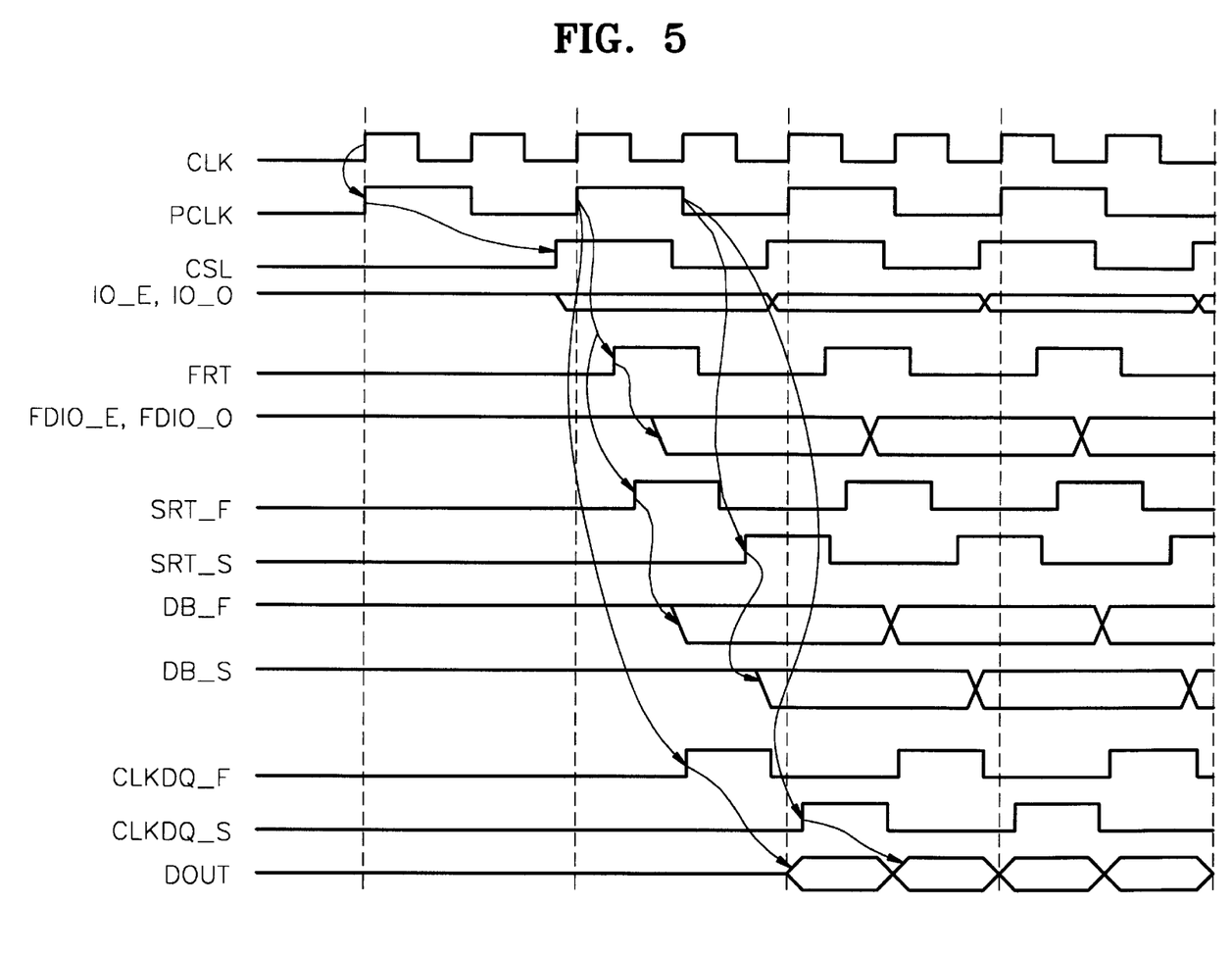
FIG. 5 is a timing diagram which illustrates operation of the memory device of FIG. 1 during single data rate (SDR) mode operation.

The delay unit 60 of FIG. 3 includes first through fifth delay units 62 through 70. These delay units generate the control signals FRT, SRT_F, SRT_S, CLKDQ_F and CLKDQ_S. The first delay unit 62 delays the internal clock signal PCLK by a predetermined amount of time, often a 0→1 transition of PCLK and generates the first control signal FRT. The internal clock signal PCLK may have a period of 8 ns and a duty ratio of 43.75%. Also, the delay introduced to generate the first control signal FRT may be 1.5 ns. The second delay unit 64 delays the internal clock signal PCLK by 2.5 ns after a 0→1 transition of PCLK and outputs the delayed clock as the second control signal SRT_F. The third delay unit 66 delays PCLK by 6.5 ns relative to a 1→0 transition of PCLK and outputs the delayed clock as the third control signal SRT_S. The fourth delay unit 68 delays PCLK by 4.5 ns and outputs the delayed clock as the fourth control signal CLKDQ_F. The fifth delay unit 70 delays PCLK by 8.5 ns relative to a 1→0 transition of PCLK and outputs the delayed clock as the fifth control signal CLKDQ_S. Waveforms of the control signals FRT, SRT_F, SRT_S, CLKDQ_F and CLKDQ_S are shown in FIGS. 4 and 5. In the present embodiment, the first through fifth delays 62 through 70 are preferably implemented using phase-locked loops (PLL) or delay-locked loops (DLL). However, other delay circuits may be used as well. Meanwhile, instead of generating the control signals by delaying the internal clock PCLK separately, some of the control signals may be generated by delaying one of the other control signals.

Referring now to FIG. 4, operation of the memory device of FIG. I during a dual data rate (DDR) mode includes the generation of an internal clock signal PCLK having the same period (e.g., 16 ns) as the external clock signal CLK since /DDR=0 and the transmission gate 54 is turned on. As illustrated, a rising edge of the internal clock signal PCLK can be used to trigger the timing of the column select signal CSL and the transfer of read data from the even and odd memory cores 10 and 20 to the even and odd local I/O lines 19a and 19b, using addressing and bit line amplifying techniques well known to those skilled in the art. The rising edge of the internal clock signal PCLK can also be used to trigger the generation of logic 1 pulses on the first, second and fourth control signal lines FRT, SRT_F and CLKDQ_F. The phases of these logic 1 pulses relative to the internal clock signal PCLK is set by the delays associated with delay units 62, 64 and 68 (e.g., 1.5, 2.5 and 4.5 nanoseconds). The read data on the even and odd local input/output lines IO_E and IO_O is then passed to the even and odd global I/O lines FDIO_E and FDIO_O, in response to the logic 1 first control signal FRT.

The falling edge of the internal clock signal PCLK can also be used to trigger the generation of logic 1 pulses on the third and fifth control signal lines SRT_S and CLKDQ_S. The phases of these logic 1 pulses relative to the internal clock signal PCLK is set by the delays associated with delay units 66 and 70 (e.g., 6.5 and 8.5 nanoseconds).

Accordingly, if the first column address during burst mode operation is an even address, then even read data will be transferred from the even global I/O line FDIO_E to the first data bus DB_F and odd read data will be transferred from the odd global I/O line FDIO_O to the second data bus DB_S. The even data will then be transferred from the first data bus DB_F to the data out signal line DO when the fourth control signal CLKDQ_F transitions from 0→1 at the multiplexer 48. The odd data will then be transferred from the second data bus DB_S to the data out signal line DO when the fifth control signal CLKDQ_S transitions from 0→1. Thus, each period of the internal clock signal PCLK will result in the transfer of even data from an even address in the first memory core 10 to data line DO followed by a transfer of odd data from an odd address in the second memory core 20 to data line DO, as illustrated by FIG. 4. Alternatively, if the first column address during burst mode operation is an odd address, then odd read data will be transferred from the odd global I/O line FDIO_O to the first data bus DB_F and even read data will be transferred from the even global I/O line FDIO_E to the second data bus DB_S. The odd data will then be transferred first from the first data bus DB-F to the data out signal line DO when the fourth control signal CLKDQ_F transitions from 0→1 at the multiplexer 48. The even data will then be transferred from the second data bus DB_S to the data out signal line DO when the fifth control signal CLKDQ_S transitions from 0→1. Thus, each period of the internal clock signal PCLK will result in the transfer of odd data first from an odd address in the second memory core 10 to data line DO followed by a transfer of even data from an even address in the first memory core 10 to data line DO, as illustrated by FIG. 4.

The above discussion also applies equally to the timing diagram of FIG. 5 which illustrates a single data rate (SDR)

mode, however, during the SDR mode the period of the external clock signal CLK is illustrated as 8 ns. In order to handle this higher external clock frequency, signal /DDR is set to a logic 1 value. Thus, signal PCLK_SDR having a period of 16 ns can be passed through transmission gate 56 as the internal clock signal PCLK and each period of the internal clock signal can result in the transfer of one bit of even data and one bit of odd data from the multiplexer 48.

According to still further aspects of the present invention, the first and second data bus selectors 44 and 46 were included because a column address strobe (CAS) latency of 3 clock periods is assumed in the embodiment of FIGS. 1–3. However, if a CAS latency of 2 clock periods is available, the first and second data bus selectors 44 and 46 can be omitted and the selection of the even and odd data buses may be carried out by the multiplexer 48. Finally, in the event the CAS latency of 4 or more clock periods, an additional delay stage may be included. In addition, both the DDR mode internal clock PCLK_DDR and the SDR mode internal clock PCLK_SDR may be obtained by dividing the system clock CLK_DDR, so that both the frequencies of the PCLK_DDR and the PCLK_SDR may be different from that of the system clock CLK.

The number of memory cores which simultaneously input or output data may also be more than two. In such a case, it is preferable that the number of the I/O sense amplifiers, the number of selectors and the number of data buses in FIG. 2 equal the number of memory cores. To handle the increased number of memory cores, the number of multiplexers and the number of control signals may need to increase. Finally, if the frequency of the internal clock signal for the multiple data rate mode (i.e., PCLK_m) is generated by dividing the frequency "f" of the system clock CLK by m, the frequency of PCLK_m and the frequency PCLK_SDR will be f/m and f/mn, respectively, where n is the value of the divider in divider 52.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   first and second memory banks;
   first and second local data lines electrically coupled to said first and second memory banks, respectively;
   a multiplexer having first and second inputs electrically coupled to first and second data bus lines, respectively; and
   a data selection circuit which routes data from the first and second local data lines to the first and second data bus lines, respectively, when a selection control signal is in a first logic state and routes data from the second and first local data lines to the first and second data bus lines, respectively, when the selection control signal is in a second logic state opposite the first logic state.

2. The memory device of claim 1, further comprising a control signal generator which generates the selection control signal in the first and second logic states when a first address in a string of burst addresses is even and odd, respectively.

3. The memory device of claim 1, wherein said data selection circuit comprises:
   a first sense amplifier having an input electrically coupled to the first local data line;
   a second sense amplifier having an input electrically coupled to the second local data line;
   a first selector having a first input electrically coupled to an output of said first sense amplifier and a second input electrically coupled to an output of said second sense amplifier; and
   a second selector having a first input electrically coupled to the output of said first sense amplifier and a second input electrically coupled to the output of said second sense amplifier.

4. The memory device of claim 3, wherein said first and second sense amplifiers are both responsive to a first control signal; wherein said first and second selectors are responsive to second and third control signals, respectively; wherein said multiplexer is responsive to fourth and fifth control signals; and wherein the fourth and fifth control signals are delayed versions of the second and third control signals, respectively.

5. The memory device of claim 4, further comprising an internal clock generator which generates an internal clock signal; and wherein the second and third control signals are in-sync with opposite edge transitions of the internal clock signal.

6. The memory device of claim 4, wherein the first, second and fourth control signals are in-sync with a rising edge of the internal clock signal; and wherein the third and fifth control signals are in-sync with a falling edge of the internal clock signal.

7. An integrated circuit memory device, comprising:
   first and second memory banks;
   first and second local data lines electrically coupled to said first and second memory banks, respectively;
   a control signal generator which is responsive to an external clock signal, generates an internal clock signal having a period equal to nT or T/n, where n is an integer and T is a period of the external clock signal, and generates first through fifth control signals which are each in-sync with either rising or falling edges of the internal clock signal;
   a multiplexer responsive to the fourth and fifth control signals and having first and second inputs electrically coupled to first and second data bus lines, respectively; and
   a data selection circuit which is responsive to the first through third control signals and a selection control signal and routes data from the first and second local data lines to the first and second data bus lines, respectively, when the selection control signal is in a first logic state and routes data from the second and first local data lines to the first and second data bus lines, respectively, when the selection control signal is in a second logic state opposite the first logic state.

8. The memory device of claim 7, wherein said control signal generator generates the selection control signal in the first and second logic states when a first address in a string of burst addresses is even and odd, respectively.

9. The memory device of claim 7, wherein said data selection circuit comprises:
   a first sense amplifier having an input electrically coupled to the first local data line;
   a second sense amplifier having an input electrically coupled to the second local data line;
   a first selector having a first input electrically coupled to an output of said first sense amplifier and a second input electrically coupled to an output of said second sense amplifier; and a second selector having a first input electrically coupled to the output of said first sense amplifier and a second input electrically coupled to the output of said second sense amplifier.

10. The memory device of claim 9, wherein said first and second sense amplifiers are both responsive to the first control signal; wherein said first and second selectors are responsive to the second and third control signals, respectively; wherein said multiplexer is responsive to the fourth and fifth control signals; and wherein the fourth and fifth control signals are delayed versions of the second and third control signals, respectively.

11. A semiconductor memory device operating in synchronicity with an external system clock, comprising:

a first memory core for storing a plurality of data and outputting data addressed by a row address and a first column address to a first data line;

a second memory core for storing a plurality of data and outputting data addressed by the row address and a second column address;

a control signal generator for generating a first clock having an integer multiple period of the external system clock and a second clock having twice period of the first clock, and outputting one selected of the first and the second clocks as an internal clock; and an amplifying and multiplexing circuit, operating in synchronicity with the internal clock, for receiving data output by said first and second memory cores and amplifying and multiplexing the received data to output the multiplexed data.

12. The memory device of claim 11, wherein the first and second column addresses are consecutive, and the first column address is even-numbered and the second column address is odd-numbered.

13. The memory device of claim 11, wherein a period of the first clock is same as that of the external system clock.

14. The memory device of claim 13, wherein said control signal generator comprises:

a waveform shaping circuit for receiving the external system clock and adjusting a duty ratio of the external system clock and a swing range thereof to output the first clock having a frequency same as that of the external system clock;

a frequency divider for dividing the first clock to output the second clock; and a selection means for selecting one of the first and second clocks to output the selected clock.

15. The memory device of claim 11, wherein said amplifying and multiplexing circuit comprises:

a first input and output sense amplifier for receiving and amplifying first data output by said first memory core and outputting the first data in synchronicity with a first control signal having same frequency as the internal clock;

a second input and output sense amplifier for receiving and amplifying second data output by said second memory core and outputting the second data in synchronicity with the first control signal; and a multiplexing subcircuit for receiving the first and second data and multiplexing the first and second data in response to a selection control signal indicating a sequence of the first and second data.

16. The memory device of claim 15, wherein the multiplexing subcircuit comprises:

a first selector for receiving the first and second data, and selecting one having a leading address of the first and second data in response to the select control signal to output the selected data in response to the second control signal;

a second selector for receiving the first and second data and selecting one having a following address of the first and second data to output the selected data in response to the third control signal; and a multiplexer for receiving output data of said first and second selectors and outputting data from said first selector in response to the fourth control signal having same frequency as the internal clock and data from said second selector in response to the fifth control signal having same frequency as the internal clock to multiplex the received data.

17. The memory device of claim 11, further comprising a mode register for storing an operation mode information and outputting a mode control signal to said control signal generator, wherein the control signal generator selects one of the first and second clocks in response to the operation mode control signal.

18. The memory device of claim 11, wherein said control signal generator includes a fuse indicating the operation mode, and selects one of the first and second clocks according to a state of said fuse.

19. The memory device of claim 11, wherein a selection of the first or second clock by the control signal generator is fixed by a metallization pattern process.

20. A method of controlling output of a semiconductor memory device operating in synchronicity with an external system clock, including first and second memory cores for storing data, said method comprising the steps of:

generating a first clock having an integer multiple period of the external system clock and a second clock having a period of twice a period of the first clock, and selecting one of the first and second clocks as an internal clock;

amplifying first and second data output by the first and second memory cores, respectively, and outputting the amplified first and second data to the first and second data lines, respectively, in synchronicity with a first control signal having same period as the internal clock;

selecting one having a leading address of the amplified first and second data from the first and second memory cores to output the selected data externally; and selecting one having a following address of the amplified first and second data to output the selected data externally.

* * * * *